United States Patent [19]
Davis et al.

[11] Patent Number: 5,093,759
[45] Date of Patent: Mar. 3, 1992

[54] REPLACEABLE ELECTRONICS BOX

[75] Inventors: Robert E. Davis, Peoria; John E. Hockett, Phoenix, both of Ariz.

[73] Assignee: Honeywell, Inc., Minneapolis, Minn.

[21] Appl. No.: 527,110

[22] Filed: May 21, 1990

Related U.S. Application Data

[63] Continuation of Ser. No. 284,168, Dec. 13, 1988, abandoned.

[51] Int. Cl.[5] ............................................. H05K 7/20
[52] U.S. Cl. .................................. 361/386; 361/415; 439/76
[58] Field of Search ................ 439/61, 62, 74, 76, 439/485; 211/41; 165/80.3, 185; 361/381–383, 386, 387, 388, 391, 393–395, 412, 413, 415

[56] References Cited

U.S. PATENT DOCUMENTS

| | | | |
|---|---|---|---|
| 2,468,727 | 5/1949 | Bauman | 361/391 |
| 2,879,492 | 3/1959 | Kikta | 361/391 |
| 2,933,713 | 4/1960 | Jackson | 361/391 |
| 4,361,861 | 11/1982 | Spapens | 361/391 |
| 4,546,407 | 10/1985 | Benenati | 361/386 |
| 4,656,559 | 4/1987 | Fathi | 361/386 |

Primary Examiner—Gerald P. Tolin
Attorney, Agent, or Firm—William W. Holloway; Roger W. Jensen; Dale E. Jepsen

[57] ABSTRACT

An electronics box includes a cover and a bottomwall spaced from the cover by opposed sidewalls of the box. A motherboard having circuit card connectors thereon is mounted in the electronics box adjacent the cover. The box further includes in-line connectors mounted adjacent the motherboard with the in-line connectors interconnected with the connectors in the motherboard. The bottomwall and sidewalls include circuit card edge guides formed therein for retaining circuit cards connected to the motherboard.

The arrangement of the in-line connectors adjacent to the motherboard provides for relatively direct and short runs for the interconnecting harness cable, thereby minimizing the amount of space within the box devoted to internal interconnect cables.

The in-line connectors provide for straight-line connection or disconnection, making possible direct mounting with a simple jackscrew arrangement.

15 Claims, 4 Drawing Sheets

REPLACEABLE ELECTRONICS BOX

This is a continuation of copending application Ser. No. 07/284,168 filed on Dec. 13, 1988, now abandoned.

BACKGROUND AND SUMMARY

The present invention relates to an electronics box for use on spacecraft such as a shuttle orbiter or space station and, more particularly, to in-orbit replaceable electronic boxes.

In general, spacecraft and space technology have developed to the point where lengthy missions are feasible and more or less permanent in-orbit stations are being developed for deployment in space. Such development presents a need for in-orbit replacement by spacesuited crew members or by robotic means, such as a robotic manipulation arm, of boxes or modules containing electronic circuit cards necessary for the functioning and control of the spacecraft. In the zero-gravity or near vacuum environment of space, it is desirable to accomplish such in-orbit replacement of the electronic boxes as rapidly as possible.

Several conventional means of fastening such boxes to mounting racks or platforms have been proposed for use on spacecraft such as multiple captive bolts shown in FIG. 1, or a keyhole arrangement with a captive fastener, shown in FIG. 2, or J-hook and captive fastener combination shown in FIG. 3.

The use of multiple captive bolts shown in FIG. 1 has the advantage providing the required intimate and high contact pressure between the box and its mounting surface. However, this fastening scheme is time consuming due to the plurality of fasteners requiring manipulation and does not led itself to ready handling by spacesuited crew members or robotic manipulator arms.

The keyhole captive fastener approach shown in FIG. 2 has the same contact pressure advantage as the multiple captive bolts of FIG. 1 plus, the additional advantage of providing a means of holding the electronics box in place during the manipulation of the captive fasteners. However, this arrangement also is not conducive to ready handling by crew members or robotic arms.

The J-hook/captive fastener arrangement shown in FIG. 3 provides the same advantages and disadvantages as the keyhole captive fastener arrangement discussed above.

Additionally, the near vacuum conditions experienced by spacecraft require that all of the heat generated by the components on the electronic circuit cards be dissipated by conduction. In some spacecraft applications, such heat is dissipated by conduction through a heat dissipating surface commonly called a coldplate, which forms the mounting surface for the electronics box. For effective heat dissipation, an intimate and high contact pressure is required at the interface between the electronics box and the coldplate.

All of the above mentioned fastening schemes are susceptible to scuffing of the coldplate as the electronics box is manipulated into position so as to align the fasteners with mating receptacles on the mounting surface. Such scuffing of the coldplate tends to degrade the heat dissipating effectiveness at the coldplate interface due to somewhat lessened contact surface at the interface.

To provide electrical or optical interconnection between the electronics box and the rest of the spacecraft, conventional electrical connectors have been proposed including pig-tailed electrical conductor cables terminating in twist-clock cylindrical connectors, partially shown at FIG. 1 and FIG. 5, available, for example, from Allied Amphenol Products of Oak Brook, Ill.

The twist-lock cylindrical connectors provide for positive and secure interconnections. However, such connectors are not rapidly manipulated by spacesuited crewmembers due to the rotational movement required and, if the electronics box is provided with a plurality of such connectors, the disconnection and reconnection of each connector becomes a time consuming process.

Two other problems are addressed by the instant invention involving, firstly, the heat conduction path within the electronics box from the circuit cards to the coldplate interface and secondly, the internal routing of electrical wires or cables from the circuit card connectors mounted in the motherboard to the cylindrical electrical connectors used for external connection of the electronics box.

Heat conduction path within conventional electronics boxes for spacecraft are arranged as shown in FIG. 4. Each circuit card is provided with a thermal plane formed of an efficient heat conductor such as copper which provides a heat sink for the electronic components mounted on the circuit card. The thermal plane is coextensive with the peripheral edges of the circuit card.

The circuit cards are mounted in individual card edge guides formed in the outer walls of the box. The circuit card is usually inserted into a receptacle in a motherboard which is positioned between the circuit card and the bottom of the box. The circuit card thermal plane is held in intimate heat conducting contact with the edge guides which, in turn, carry the heat to electronics box coldplate interface formed on the bottom surface of the box. However, with the motherboard interposed between the circuit card and the bottom mounting surface of the box, the only heat transfer occurs along the sidewall edge guides. In this arrangement, heat from the upper portion of the circuit card must be conducted the full height of the circuit guide before it can be transferred to the coldplate interface.

Electrical connection between the cylindrical connectors mounted on the endwall of the electronics box, shown in FIG. 5, is accomplished by means of pig-tail harness cable or flex cable (not shown) connections at both the circuit card receptacle on the motherboard and the external cylindrical electrical connections. As can be seen in FIG. 5, the sequential routing of the cables or flex circuit cables (not shown) to the external cylindrical connectors from the furthest circuit cards to the nearest circuit cards leads to an inefficient use of the internal volume of the box resulting in the necessity of providing a larger electronics box with sufficient volume to accommodate the necessary cable routings.

An object of the present invention is to provide an electronics box that permits rapid manual or robotic in-orbit replacement of the electronic box.

Another object of the present invention is to provide an electronics box that permits in-orbit removal and replacement of the electronics box without scuffing the coldplate or coldplate interface surface.

Another object of the present invention is to provide the electronics box with a fastening means for rapidly securing the box to its mounting surface.

Another object of the present invention is to provide the electronics box with a short path internal cable routing between the circuit card receptacle on the motherboard and the external electronics box connector.

Another object of the present invention is to provide the electronics box with a short direct internal heat conducting path between the circuit card thermal plane and the box coldplate interface.

Another object of the present invention is to provide in-line connectors which require a straight-line motion to mate as the box is drawn down against its mounting surface.

The electronics box contemplated by this invention includes a cover and a bottomwall spaced from the cover by opposed sidewalls of the box. A motherboard having circuit card connectors is mounted in the box adjacent to the cover. The box further includes in-line connectors mounted adjacent to the motherboard with the in-line connectors interconnected with the circuit card connectors mounted on the motherboard. Further advantages and details of our invention can be had from the following description and claims taken together with the accompanying drawing.

DETAILED DESCRIPTION

Figure 1:
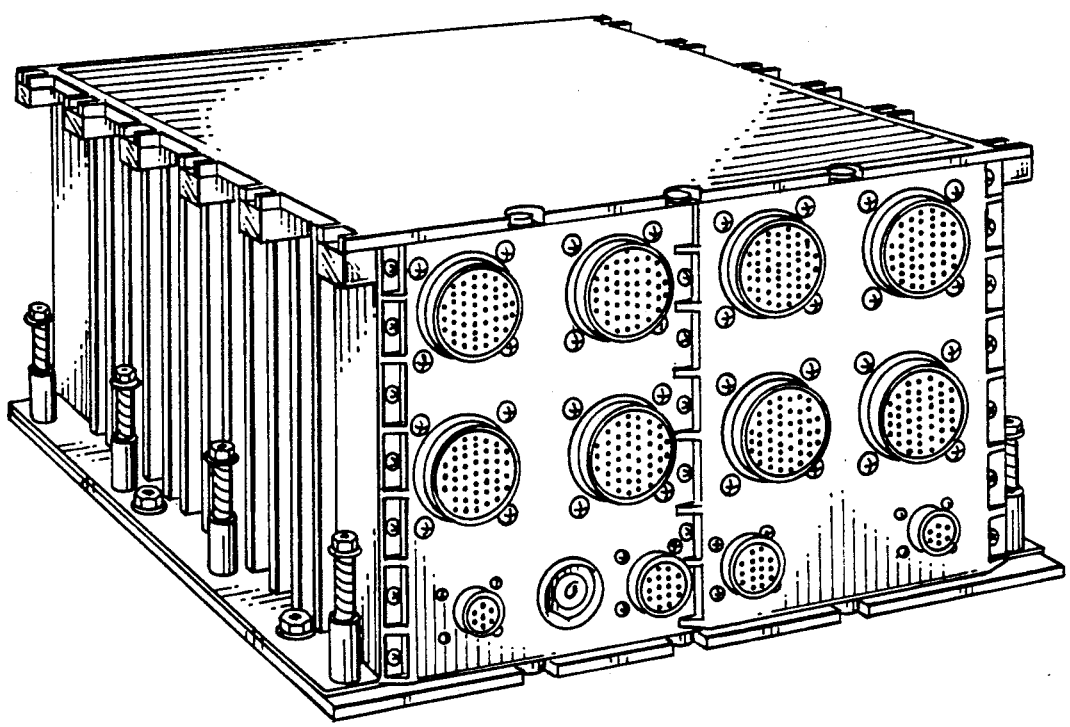
FIG. 1 is a conventional electronics box proposed for spacecraft use showing captive bolt fastening.
Figure 2:
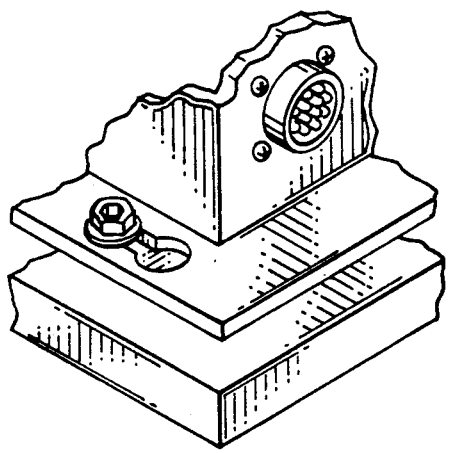
FIG. 2 is a partial view electronics box of FIG. 1 showing a conventional keyhole type fastening arrangement.
Figure 3:
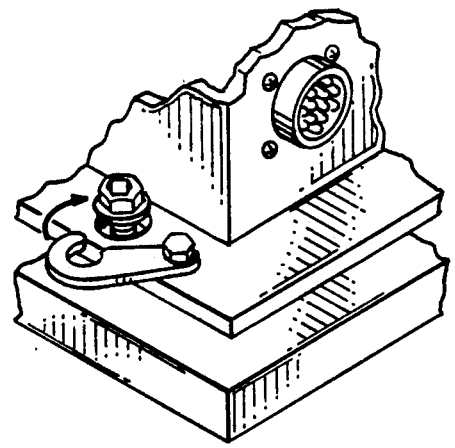
FIG. 3 is a partial view of the electronics box of FIG. 1 showing a conventional J-hook type fastening arrangement.
Figure 4:
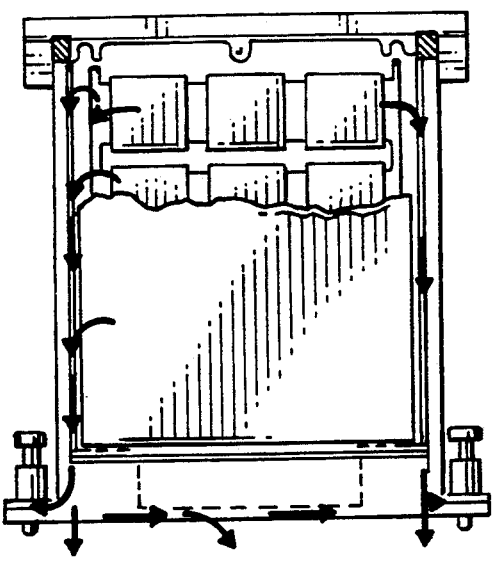
FIG. 4 is a partial interior view of the electronics box of FIG. 1 showing the conventional internal heat conducting path.
Figure 5:
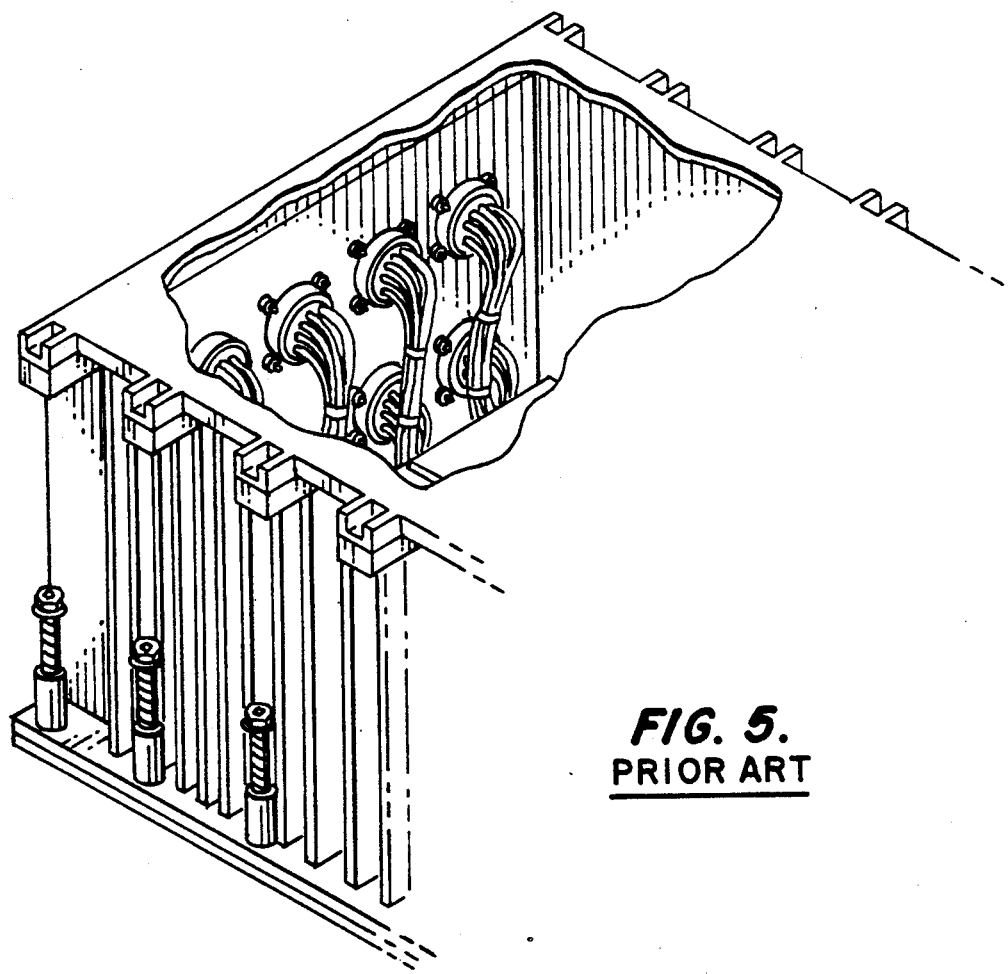
FIG. 5 is a partial perspective view of the electronics box of FIG. 1 with a portion of the top cover cut away to show the internal cable termination.
Figure 6:
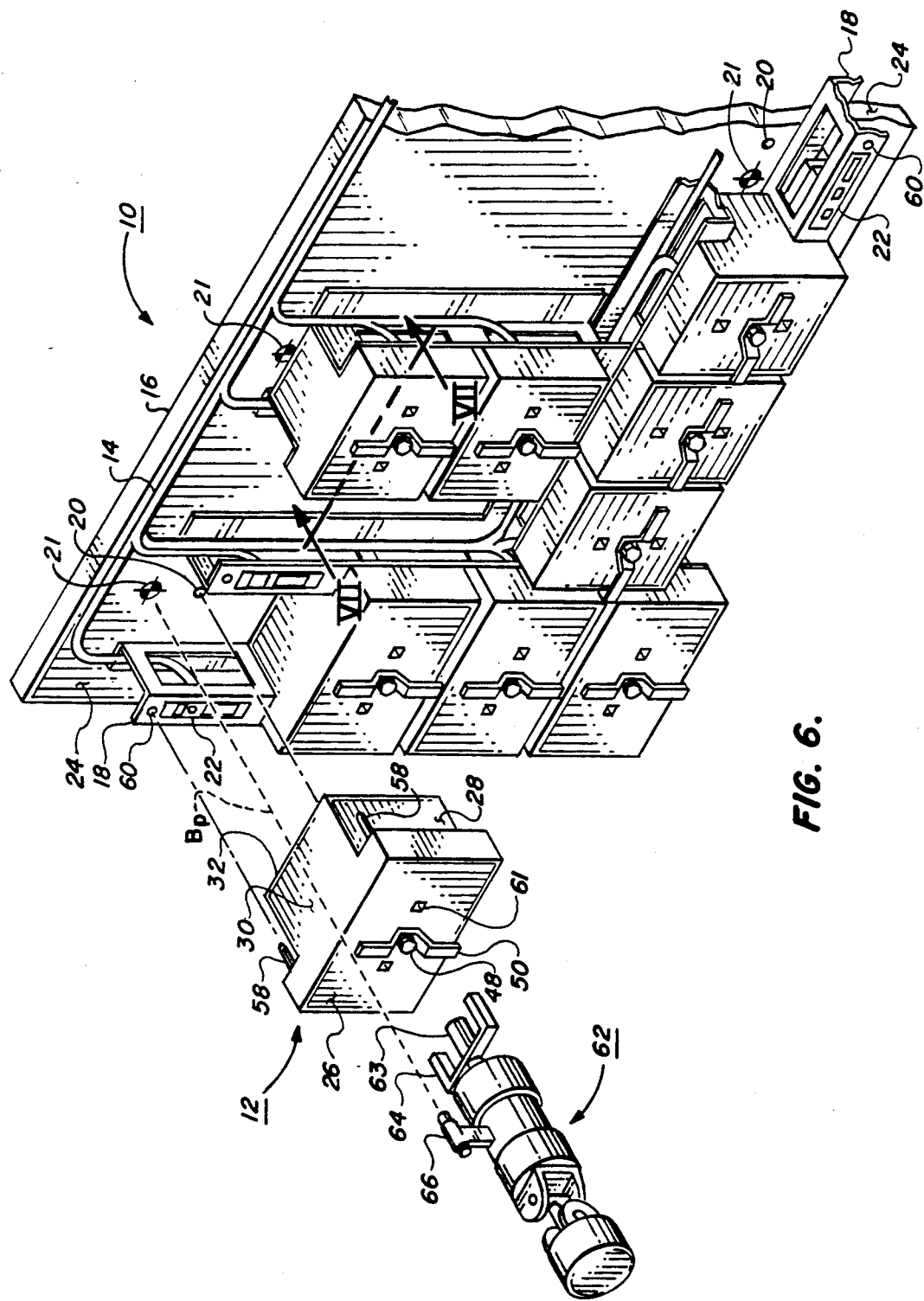
FIG. 6 is a partial perspective view of the electronics box of the present invention showing a plurality of electronics boxes mounted on the mounting system and an exploded view showing the orientation of an electronics box to the mounting system assembly.

Referring now to the drawing for an example of the construction and use of the electronic box 12 of this invention and of a mounting system 10, suitable for use on spacecraft, is shown generally at FIG. 6 and comprises a mounting system 10, one or more an electronics boxes 12 and a plurality of interconnecting harness cables 14.

The mounting system 10 includes, for example, a heat exchange or heat dissipating member 16, sometimes called a coldplate, which forms a mounting base for a plurality of connector brackets 18 which are mounted in either vertical or horizontal orientation as shown in FIG. 6. The connector brackets 18 have in-line connectors 22, 44 (FIG. 7) mounted in pairs on oppositely spaced brackets 18. In-line connectors are any electrical or optical connectors capable of being inserted into a mating connector in a straight-line fashion for making electrical or optical connections. Examples of such in-line connectors may be found in the catalog "Rack and Panel Connectors" Number RP-1 issued by ITT Cannon of Fountain Valley, Calif. Connector brackets 18 also form harness cable channels 24 with each harness cable 14 terminating at in-line connector 22. The harness cables 14 provide for electrical power transfer or electrical or optical signal transfer between the electronics box 12 to and from other locations on the spacecraft. The coldplate 16 includes a fastener receptacle 20 and coded target 21 between each pair of the spaced apart connectors 22.

The coldplate member 16 can be made of material suitable for performing the necessary heat exchange or heat dissipating function as long as it is provided with the necessary mechanical strength to support the connector brackets, harness cables, and electronics boxes.

Figure 7:
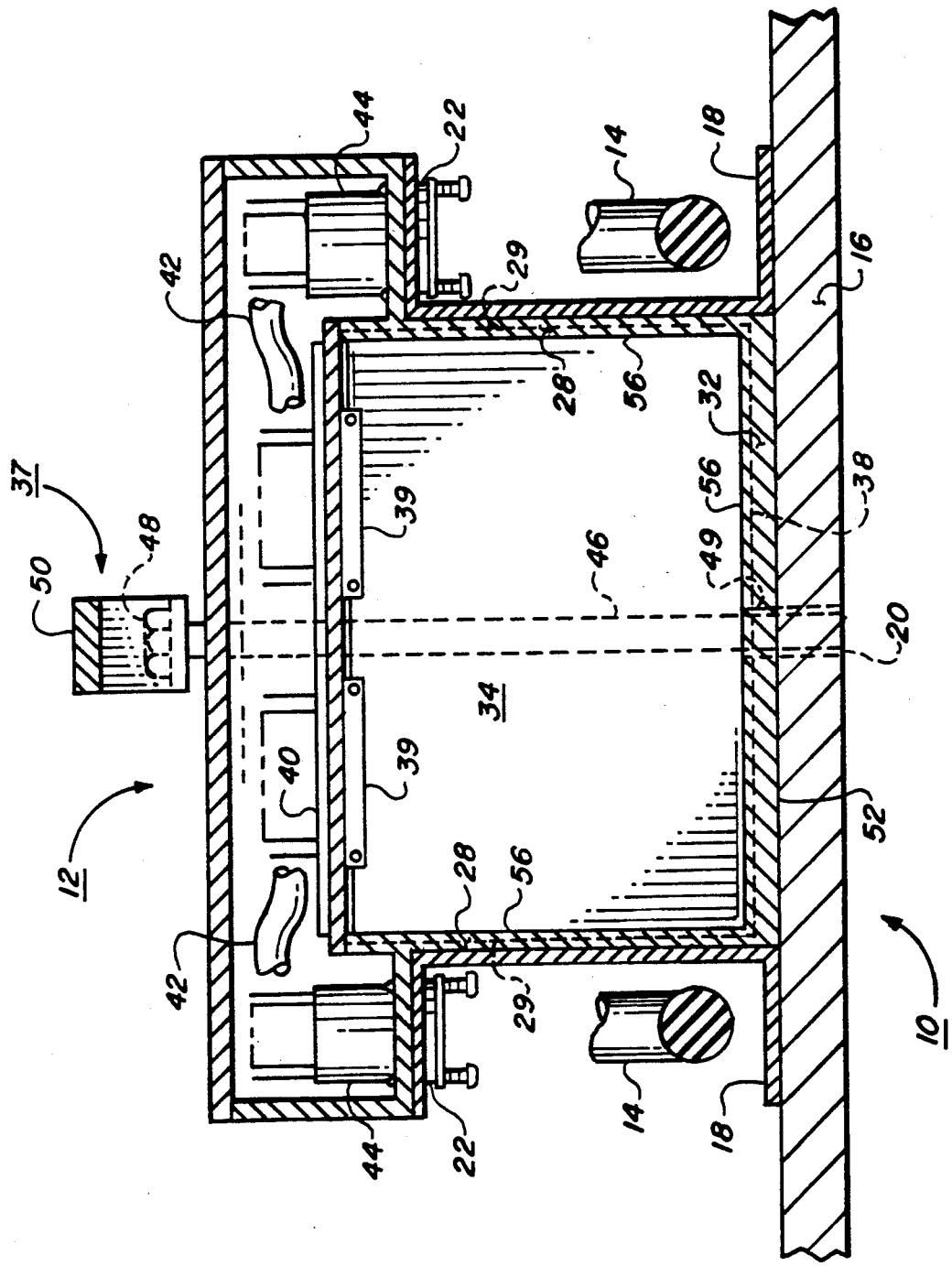
FIG. 7 is a sectional view taken along plane 7—7 of FIG. 6.

The electronics box 12 shown in more detail at FIG. 7 includes a cover 26, a pair of opposed sidewalls 28, a pair of opposed endwalls 30 (FIG. 6), a bottomwall 32 spaced from and opposite to cover 26 by sidewalls 28 and endwalls 30 and includes one or more of circuit cards 34. Sidewalls 28 and bottomwall 32 are formed with a plurality of conventional circuit card edge guides, not shown.

A motherboard 40 is mounted in box 12 adjacent cover 26 and includes one or more conventional circuit card connectors 39 connected by harness cables 42 to in-line connectors 44 mounted in the box 12 adjacent motherboard 40. Positioning the in-line connector 44 in box 12 adjacent the motherboard 40 provides for relatively direct and short runs for harness cables 42 and minimizes the amount of space required in box 12 for interconnect harness cable 42.

Circuit cards 34 are formed with a conventional thermal plane 56 which extends to the periphery or circuit card 34 and is coextensive therewith. Circuit cards 34 are mounted in the circuit card edge guides, shown as dotted lines 29, formed in sidewalls 28 and bottomwall 32 and are connected to the motherboard through circuit card receptacle connectors 39. Cover member 26 may be fastened, for example, to sidewalls 28 or endwalls 30 by any suitable fastening means, not shown, such as screws or bolts.

A fastener, such as, jackscrew 37 includes a threaded bolt 46 having one end terminating in a tool grapable end, such as, hex head 48 and handle 50 at the exterior of cover 26. Bolt 46 extends centrally through cover 26 and box 12 and exits through an aperture 49 formed in bottomwall 32.

Bottomwall 32 includes a coldplate interface surface 52 preferably formed of highly heat conductive material such as aluminum, for example. The circuit card edge guides, shown as dotted line 38 function as heat exchange grooves formed in bottomwall 32. These guides are designed in a conventional manner to receive the thermal plane 56 that is at the periphery of circuit card 34. Thermal plane 56 is held in intimate heat conducting relationship with the heat exchange grooves by means of conventional circuit card retainers, not shown. Such card retainers are available, for example, from Calmark Corporation of San Gabriel, California or Rexnord Specialty Fastener Divison, Hasbruck Heights, N.J.

As shown in FIG. 6, electronic box 12 includes a pair of guide pins 58 which align with guide apertures 60 formed in connector brackets 18. Guide pins 58 ar useful in the event that removal and replacement of box 12 is accomplished manually by spacecraft crew members. The interaction between guide pin 58 and guide aperture 60 ensure the alignment of in-line connectors 22 and 44 respectively and minimizes potential scuffing of coldplate interface 5 and the surface of coldplate 16.

For robotic manipulation of box 12, cover 26 is provided with keyways or slots 61 positioned on either side of jackscrew 37. A remotely operated robotic manipulator arm 62, FIG. 6, includes a pair of non-rotating end fingers 64, a rotatable tool member 63 located between end fingers 64, and an optical sensor 66, such as a miniature video camera. End fingers 64 mate with and are retained in slots 61 to hold box 12 and permit relative rotation of tool 64. Optical sensor 66 is positioned on arm 62 so that its horizontal beam path Bp will clear box 1 and locate coded target 21 positioned on coldplate 16 at each box position on mounting system 10.

For removal of box 12 from mounting system 10, the manipulator arm 62 is positioned so that the beam path Bp of optical sensor 66 is aligned with the desired target 21. Arm 62 is advanced toward box 12 until end fingers 64 are engaged with slots 61 and tool 63 engages with hexhead 48. Upon engagement with hexhead 48, the tool 63 of robotic arm 62 is rotated in a direction so as to back out threaded bolt 46, FIG. 7, from engagement with threaded receptacle 20 in coldplate 16. Upon disengagement of bolt 46 from coldplate 16, FIG. 7, box 12 is withdrawn in a straight-line motion to disengage in-line connectors 44 from engagement with in-line connectors 22.

For robotic installation, box 12 is mounted on the end of arm 62 with end fingers 64 engaged in slots 61 and tool 63 is engaged with hexhead 48. Optical sensor 66 is aligned with a desired target 21 and as manipulator arm 62 is advanced toward coldplate 16 guide pins 58 on box 12 engage with apertures 60 on connector bracket 18. As mentioned previously, the interaction between pins 58 and apertures 60 assure alignment of connectors 22 and 44 respectively and additionally ensure the engagement of bolt 46 with receptacle 20 on coldplate 16. As coldplate interface surface 52 on box 12 contacts coldplate 16, the tool 63 on robotic arm 62 is rotated in a direction to engage threaded receptacle 20 to draw and hold interface surface 52 intimate contact with coldplate 16. Upon attaining a predetermined torque load on jackscrew 37, robotic arm 62 releases engagement of tool 63 with hexhead 48 and end fingers 64 engagement with keyway 61.

This invention has been described in detail in connection with the disclosed embodiments, but these are examples only and this invention is not restricted thereto. It will be understood by those skilled in the art that other variations and modifications can be made within the scope of this invention.

For example, the advantages of using in-line connectors for straight line insertion and removal of the box is not limited by a particular heat dissipation scheme nor is the advantage of having the motherboard interconnections with the adjacent in-line connectors limited by any particular heat dissipation scheme. Nor are the in-line connectors restricted to a particular geometrical shape whether rectangular, square or round The important requirement being that of connection or disconnection of the box to its mounting system be accomplished in a straight-line motion.

What is claimed is:

1. An electronics box detachably coupled to a planar element, said planar element having conductors for electrically coupling a plurality of said electronics boxes, said planar element being a thermal heat sink, said electronics box comprising:
   a) a cover;
   b) a motherboard mounted adjacent said cover;
   c) at least one circuit card connector means mounted on said motherboard;
   d) in-line connector means mounted perpendicular to said cover and adjacent said motherboard, said in-line connector means being coupled to said circuit card connector means;
   e) a circuit card coupled to said circuit card connector means;
   f) a first and a second sidewall;
   g) a bottomwall connected to and spaced from said cover by said sidewalls, said bottomwall having a thermal surface for transferring heat therefrom by thermal conduction, said bottomwall being in thermal contact with a circuit card; and
   h) a connector positioning said thermal surface in contact with said planar element at a preselected location, wherein said in-line connectors extend toward said planar element and electrically to selected ones of said planar element conductors in an operational configuration, said thermal surface being in thermal contact with said planar element in said operational configuration.

2. The electronics box of claim 1 wherein said connector includes fastener means mounted in said cover and extending through said bottomwall.

3. The electronics box of claim 1 wherein said sidewalls include circuit card edge guides formed therein which engage said circuit card.

4. The electronics box of claim 3 wherein said circuit card is coupled to said circuit card connector means and wherein peripheral edges of said circuit card are retained in said circuit card edge guides.

5. The electronics box of claim 4 wherein said edge guides include means for maintaining said thermal plane in intimate heat conducting contact with said sidewalls and said bottomwall.

6. The electronics box of claim 2 wherein said connector includes jackscrew means.

7. The electronics box of claim 6 wherein said cover includes means for retaining a robotic manipulator arm.

8. The electronics box of claim 5 wherein said in-line connector means and said connector cause said thermal surface to be brought into contact with said planar element without substantial intersurface sliding.

9. An electronics box electrically and thermally coupled to a planar element of an electronic system, said planar element including conductors exchanging signals with said electronics box, said electronics box comprising:
   a) a cover;
   b) a motherboard mounted adjacent to said cover;
   c) circuit card receptacle means mounted on said motherboard;
   d) in-line connector means mounted adjacent to said mother board;
   e) connecting means adjacent said cover means electrically interconnecting said circuit card receptacle means and said in-line connector means;
   f) a first and a second sidewall;
   g) a bottomwall positioned with respect to said cover by said sidewalls, wherein heat is transferred from said electronics box by conduction through said bottomwall;
   h) circuit card means coupled to said circuit card receptacle means, said bottomwall and said sidewalls including circuit card edge guides formed therein, said circuit card means having peripheral edges retained in said circuit card edge guides, wherein heat generated by said circuit card means is transferred to said bottomwall; and i) fastener means mounted in said cover and extending through said bottomwall, said fastener means coupling said electronics box to said planar element, wherein said fastener means and said in-line connector means constrain motion of said electronic box substantially perpendicular to said planar element, said fastener means thermally coupling said bottomwall with said planar elements, said fastener means electrically coupling said in-line connector means with selected conductors.

10. The electronics box of claim 9 wherein said circuit card means include thermal plane means coextensive with said peripheral edges and said edge guides, said circuit card means including means maintaining said thermal plane means in intimate heat conducting contact with said bottomwall and said sidewalls.

11. The electronics box of claim 9 wherein said bottomwall includes a thermal transfer surface.

12. The electronics box of claim 11 wherein said fastener means extends through said thermal transfer surface.

13. The electronics box of claim 12 wherein said fastener means include jackscrew means.

14. The electronics box of claim 9 wherein said in-line connector means includes guide pins to position said electronics box during an operation coupling said electronics box to said electronics system.

15. The electronics box of claim 9 wherein said cover includes means for retaining a robotic manipulator arm.

* * * * *